(12) United States Patent
Shiu

(10) Patent No.: US 6,653,223 B1
(45) Date of Patent: Nov. 25, 2003

(54) DUAL DAMASCENE METHOD EMPLOYING VOID FORMING VIA FILLING DIELECTRIC LAYER

(75) Inventor: Leder Shiu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/192,033

(22) Filed: Jul. 9, 2002

(51) Int. Cl.[7] .......................................... H01L 21/4763
(52) U.S. Cl. .................... 438/622; 438/624; 438/637; 438/638
(58) Field of Search ............................... 438/622, 624, 438/637, 638

(56) References Cited

U.S. PATENT DOCUMENTS

| | | | |
|---|---|---|---|
| 5,705,430 A | 1/1998 | Avanzino et al. ........... 438/618 |
| 5,738,799 A * | 4/1998 | Hawkins et al. ............... 216/27 |
| 6,004,883 A * | 12/1999 | Yu et al. ..................... 438/706 |
| 6,312,874 B1 | 11/2001 | Chan et al. .................. 430/314 |
| 6,337,269 B1 | 1/2002 | Huang et al. ................ 438/618 |
| 6,440,842 B1 * | 8/2002 | Chang ......................... 438/633 |
| 6,486,557 B1 * | 11/2002 | Davis et al. ................. 257/758 |

* cited by examiner

Primary Examiner—T. N. Quach
(74) Attorney, Agent, or Firm—Tung & Associates

(57) ABSTRACT

Within a method for forming a dual damascene aperture within a microelectronic fabrication, there is employed a patterned first dielectric layer which defines at least part of a via. The patterned first dielectric layer in turn has formed thereover a blanket second dielectric layer formed such as to form a void at the location of the via and thus form an incompletely filled via. Thus when forming a trench within the blanket second dielectric layer contiguous with a re-opened via formed from the incompletely filled via, the void provides for enhanced dimensional control when forming the re-opened via from the incompletely filled via.

9 Claims, 1 Drawing Sheet

DUAL DAMASCENE METHOD EMPLOYING VOID FORMING VIA FILLING DIELECTRIC LAYER

BACKGROUND OF THE INVENTION

1. Field of the Invention

The present invention relates generally to dual damascene methods for forming patterned conductor layers within microelectronic fabrications. More particularly, the present invention relates to dual damascene methods for forming, with enhanced dimensional control, patterned conductor layers within microelectronic fabrications.

2. Description of the Related Art

Common in the art of microelectronic fabrication when forming patterned conductor layers within microelectronic fabrications is the use of damascene methods.

Damascene methods are inlaid methods, where patterned conductor layers are formed within trenches and vias while employing planarizing methods, such that the patterned conductor layers need not be etched from corresponding blanket conductor layers. Of particular significance within the context of damascene methods are dual damascene methods wherein there is simultaneously formed within a via and an overlapping trench a contiguous patterned conductor stud and conductor interconnect layer while employing a planarizing method.

While dual damascene methods are thus clearly desirable in the art of microelectronic fabrication and often essential in the art of microelectronic fabrication, dual damascene methods are nonetheless not entirely without problems in the art of microelectronic fabrication. In that regard, it is often difficult in the art of microelectronic fabrication to form while employing dual damascene methods dual damascene apertures (i.e., vias with trenches overlapping thereover) with enhanced dimensional control.

It is thus desirable in the art of microelectronic fabrication to provide dual damascene methods for forming dual damascene apertures with enhanced dimensional control.

It is towards the foregoing object that the present invention is directed.

Various dual damascene methods having desirable properties have been disclosed in the art of microelectronic fabrication.

Included among the dual damascene methods, but not limiting among the dual damascene methods, are dual damascene methods disclosed within: (1) Avanzino et al., in U.S. Pat. No. 5,705,430 (a dual damascene method employing a sacrificial via fill layer); (2) Chan et al., in U.S. Pat. No. 6,312,874 (a dual damascene method employing dielectric layers formed of low dielectric constant dielectric materials); and (3) Huang et al., in U.S. Pat. No. 6,337,269 (a dual damascene method employing three dielectric layers and three etch stop layers).

Desirable in the art of microelectronic fabrication are additional dual damascene methods which provide dual damascene apertures with enhanced dimensional control.

It is towards the foregoing object that the present invention is directed.

SUMMARY OF THE INVENTION

A first object of the present invention is to provide a dual damascene method for forming a patterned conductor layer within a dual damascene aperture within a microelectronic fabrication.

A second object of the present invention is to provide a dual damascene method in accord with the first object of the present invention, wherein the dual damascene aperture is formed with enhanced dimensional control.

In accord with the objects of the present invention, there is provided a method for forming a dual damascene aperture within a microelectronic fabrication.

To practice the method of the present invention, there is first provided a substrate. There is then formed over the substrate a patterned first dielectric layer which defines at least part of a via. There is then formed over the patterned first dielectric layer a blanket second dielectric layer deposited such as to incompletely fill the via and form a void within an incompletely filled via. There is then formed over the blanket second dielectric layer an etch mask layer which defines the location of a trench to be formed through the blanket second dielectric layer and overlapping the via. There is then etched the blanket second dielectric layer, while employing the etch mask layer, to form the trench overlapping a re-opened via formed from the incompletely filled via.

The present invention provides a dual damascene method for forming a patterned conductor layer within a dual damascene aperture within a microelectronic fabrication, wherein the dual damascene aperture is formed with enhanced dimensional control.

The present invention realizes the foregoing object when forming the dual damascene aperture by forming over a patterned first dielectric layer which defines at least part of a via a blanket second dielectric layer deposited such as to incompletely fill the via and form a void within an incompletely filled via. Thus, when etching a trench through the blanket second dielectric layer in a fashion such as to re-open the incompletely filled via and form therefrom a re-opened via, the re-opened via within the dual damascene aperture is formed with enhanced dimensional control since the void provides for more efficient and uniform etching of portions of the blanket second dielectric layer formed within the incompletely filled via when forming the re-opened via therefrom.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which forms a material part of this disclosure, wherein.

DESCRIPTION OF THE PREFERRED EMBODIMENT

The present invention provides a dual damascene method for forming a patterned conductor layer within a dual damascene aperture within a microelectronic fabrication, wherein the dual damascene aperture is formed with enhanced dimensional control.

The present invention realizes the foregoing object when forming the dual damascene aperture by forming over a patterned first dielectric layer which defines at least part of a via a blanket second dielectric layer deposited such as to incompletely fill the via and form a void within an incompletely filled via. Thus, when etching a trench through the blanket second dielectric layer in a fashion such as to re-open the incompletely filled via and form therefrom a re-opened via, the re-opened via within the dual damascene aperture is formed with enhanced dimensional control since the void provides for more efficient and uniform etching of portions of the blanket second dielectric layer formed within the incompletely filled via when forming the re-opened via therefrom.

While the present invention provides particular value within the context of forming a dual damascene aperture within a semiconductor integrated circuit microelectronic fabrication, the present invention is not intended to be so limited. Rather, the present invention may be employed for forming dual damascene apertures within microelectronic fabrications including but not limited to integrated circuit microelectronic fabrications, ceramic substrate microelectronic fabrications and optoelectronic microelectronic fabrications.

Referring now to FIG. 1 to FIG. 4, there is shown a series of schematic cross-sectional diagrams illustrating the results of progressive stages in fabricating, in accord with a preferred embodiment of the present invention, a microelectronic fabrication having formed therein a dual damascene aperture.

Figure 1:
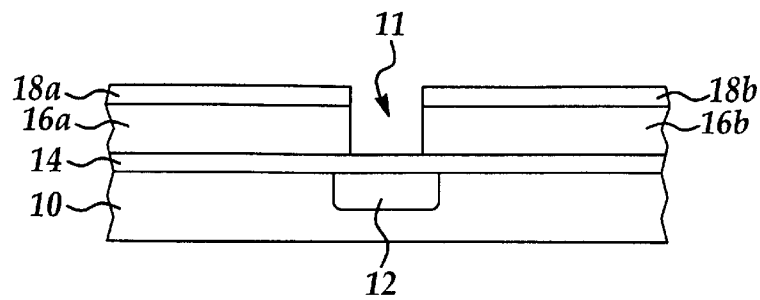
FIG. 1, FIG. 2, FIG. 3 and FIG. 4 show a series of schematic cross-sectional diagrams illustrating the results of progressive stages of forming within a microelectronic fabrication, and in accord with a preferred embodiment of the present invention, a dual damascene aperture having formed therein a contiguous patterned conductor interconnect and conductor stud layer.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention, the substrate 10 may be a substrate employed within a microelectronic fabrication selected from the group including but not limited to integrated circuit microelectronic fabrications, ceramic substrate microelectronic fabrications and optoelectronic microelectronic fabrications.

Although not specifically illustrated within the schematic cross-sectional diagram of FIG. 1, the substrate 10 may comprise a substrate alone as employed within the microelectronic fabrication, or in an alternative, the substrate 10 may consist of a substrate as employed within the microelectronic fabrication, wherein the substrate has formed thereupon and/or thereover any of several additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Although also not specifically illustrated within the schematic cross-sectional diagram of FIG. 1, the substrate 10, typically and preferably, but not exclusively, when the substrate 10 is employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention, the contact region 12 is typically and preferably either a conductor contact region or a semiconductor contact region.

Also shown within the schematic cross-sectional diagram of FIG. 1 formed upon the substrate 10, including the contact region 12, is a series of layers comprising: (1) an optional blanket first etch stop layer 14 formed upon the substrate 10 including the contact region 12; (2) a pair of patterned first dielectric layers 16a and 16b formed upon the blanket first etch stop layer 14; and (3) a pair of patterned second etch stop layers 18a and 18b formed aligned upon the pair of patterned first dielectric layers 16a and 16b.

Within the preferred embodiment of the present invention, each of blanket first etch stop layer 14 and the pair of patterned second etch stop layers 18a and 18b is typically and preferably formed of a single dielectric material, such as but not limited to a silicon oxide dielectric material, a silicon nitride dielectric material or a silicon oxynitride dielectric material, of divergent etch characteristics in comparison with a dielectric material from which is formed the pair of patterned first dielectric layers 16a and 16b.

Typically and preferably, each of the blanket first etch stop layer 14 and the pair of patterned second etch stop layers 18a and 18b is formed of a silicon nitride dielectric material formed to a thickness of from about 200 to about 1000 angstroms.

Within the preferred embodiment of the present invention, the pair of patterned first dielectric layers 16a and 16b is often, but not necessarily, formed of a lower dielectric constant dielectric material, such as a spin-on-glass (SOG) dielectric material (such as but not limited to a hydrogen silsesquioxane spin-on-glass (SOG) dielectric material or a methyl silsesquioxane spin-on-glass (SOG) dielectric material), a spin-on-polymer (SOP) dielectric material, an amorphous carbon dielectric material or a fluorosilicate glass (FSG) dielectric material. More preferably, each of the pair of patterned first dielectric layers 16a and 16b is formed of a fluorosilicate glass (FSG) dielectric material formed to a thickness of from about 3000 to about 7000 angstroms.

Figure 2:
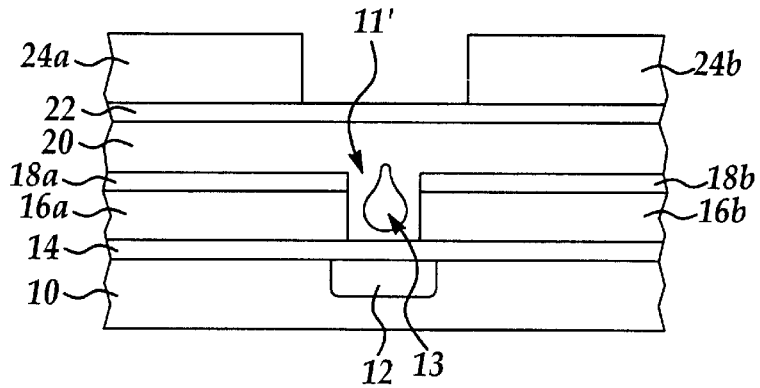

Referring now to FIG. 2, there is shown a schematic cross-sectional diagram illustrating the results of further processing of the microelectronic fabrication whose schematic cross-sectional diagram is illustrated in FIG. 1.

As is illustrated within FIG. 2, there is formed upon the pair of patterned second etch stop layers 18a and 18b, and filling the via 11, a blanket second dielectric layer 20. As is further illustrated within the schematic cross-sectional diagram of FIG. 2, the blanket second dielectric layer 20 is formed in a fashion such as to form within the blanket second dielectric layer 20 a void 13 at the location of the via 11 to thus form therefrom an incompletely filled via 11'.

Within the present invention, the blanket second dielectric layer 20 may be formed of a dielectric material analogous, equivalent or identical to the dielectric material from which is formed the pair of patterned first dielectric layers 16a and 16b. Alternatively, the blanket second dielectric layer 20 may be formed of a different dielectric material from the pair of patterned first dielectric layers 16a and 16b, under which circumstances the pair of patterned second etch stop layers 18a and 18b are not necessarily required within the present invention.

More typically and preferably, the blanket second dielectric layer 20 is, similarly with the pair of patterned first dielectric layers 16a and 16b, formed of a fluorosilicate glass (FSG) dielectric material, deposited at least in part employing a chemical vapor deposition method, such as to form the blanket second dielectric layer 20 having formed therein the void 13 which occupies from about 30 to about 70 volume percent of the incompletely filled via 11'. Under circumstances where the via 11 is formed of a linewidth of from about 0.1 to about 0.3 microns, an effective void 13 of the foregoing volume percentage may generally be effected by adjusting conventional deposition parameters such as bias power and reactor chamber pressure.

Also illustrated within the schematic cross-sectional diagram of FIG. 2 is a blanket planarizing stop layer 22 formed upon the blanket second dielectric layer 20, as well as a pair of patterned photoresist layers 24a and 24b formed upon the blanket planarizing stop layer 22.

Within the present invention, the blanket planarizing stop layer 22 may be formed employing methods and materials analogous or equivalent to the methods and materials employed for forming the pair of patterned second etch stop layers 18a and 18b and the blanket first etch stop layer 14. Typically and preferably, the blanket planarizing stop layer 22 is formed to a thickness of from about 500 to about 1500 angstroms.

Within the preferred embodiment of the present invention, each of the pair of patterned photoresist layers 24a and 24b may be formed of photoresist materials as are conventional in the art of microelectronic fabrication, including but not limited to positive photoresist materials and negative photoresist materials.

Figure 3:
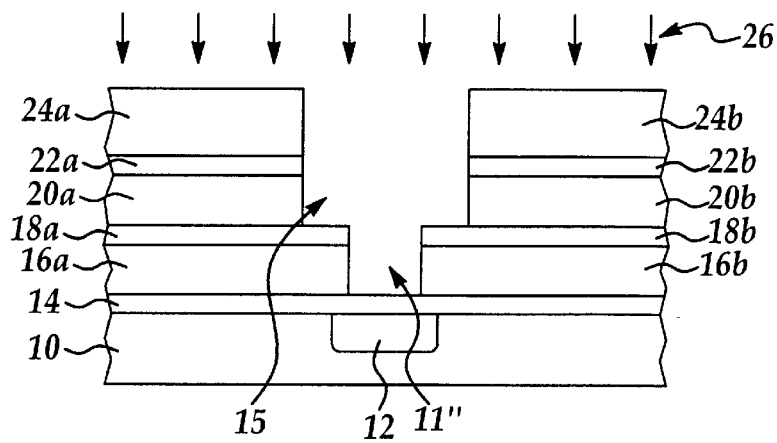

Referring now to FIG. 3, there is shown a schematic cross-sectional diagram illustrating the results of further processing of the microelectronic fabrication whose schematic cross-sectional is illustrated in FIG. 2.

As is illustrated in FIG. 3, the blanket planarizing stop layer 22 has been patterned to form a pair of patterned planarizing stop layers 22a and 22b, and the blanket second dielectric layer 20 has been patterned to form a pair of patterned second dielectric layers 20a and 20b, while employing the pair of patterned photoresist layers 24a and 24b as an etch mask layer and the pair of patterned second etch stop layers 18a and 18b and the blanket first etch stop layer 14 as a series of etch stop layers, in conjunction with an etching plasma 26. Within FIG. 3, the pair of patterned second dielectric layers 20a and 20b, and the pair of patterned planarizing stop layers 22a and 22b, define a trench 15. In turn the trench 15 overlaps a reopened via 11" defined by the pair of patterned second etch stop layers 18a and 18b and the pair of patterned first dielectric layers 16a and 16b.

Within the preferred embodiment of the present invention, the etching plasma 26 employs an etchant gas composition, or a series of etchant gas compositions, appropriate to the materials from which are formed the blanket planarizing stop layer 22 and the blanket second dielectric layer 20.

As is also understood by a person skilled in the art, incident to the presence of the void 13 within the blanket second dielectric layer 20 at the location of the incompletely filled via 11' when etching the portion of the blanket second dielectric layer 20 within the incompletely filled via 11' when forming therefrom the re-opened via 11", that portion of the blanket second dielectric layer 20 is etched more uniformly such as to preserve a uniform profile of the re-opened via 11" with respect to the via 11 and thus provide enhanced dimensional control of a dual damascene aperture (i.e., the trench 15 contiguous with and overlapping the re-opened via 11").

Figure 4:
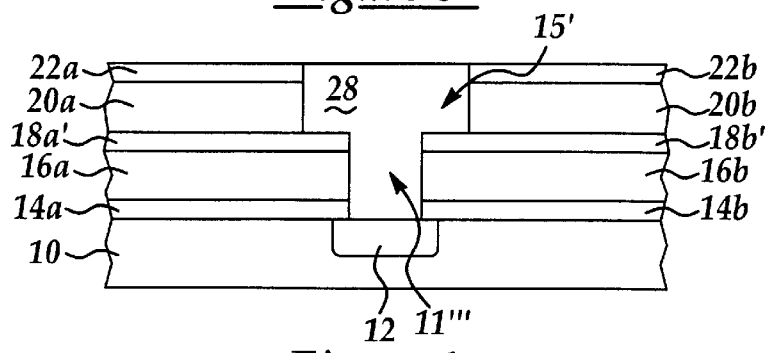

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is the results of: (1) etching the blanket first etch stop layer 14 to form a pair of patterned first etch stop layer 14a and 14b; (2) further etching the pair of patterned second etch stop layers 18a and 18b to form a pair of twice patterned second etch stop layers 18a' and 18b'; (3) stripping from the pair of patterned planarizing stop layers 22a and 22b the pair of patterned photoresist layers 24a and 24b; and (4) forming into an the extended dual damascene aperture (i.e., comprising an extended trench 15' defined by the pair of patterned planarizing stop layers 22a and 22b aligned with the pair of patterned second dielectric layers 20a and 20b in turn aligned with the pair of twice patterned second etch stop layers 18a' and 18b' overlapping with an extended via defined by the pair of patterned second dielectric layers 16a and 16b aligned upon the pair of patterned first etch stop layers 14a and 14b) a contiguous conductor interconnect and conductor stud layer 28.

Within the present invention, the pair of patterned photoresist layers 24a and 24b may be stripped employing methods and materials as are otherwise generally conventional in the art of microelectronic fabrication. Similarly, the blanket first etch stop layer 14 and the pair of patterned second etch stop layers 18a and 18b may also be patterned employing methods and materials as are generally conventional in the art of microelectronic fabrication. Finally, the contiguous patterned conductor interconnect and conductor stud layer 28 may also be formed employing methods, and in particular planarizing methods, as are also conventional in the art of microelectronic fabrication.

Upon forming the microelectronic fabrication whose schematic cross-sectional diagram is illustrated in FIG. 4, there is formed a microelectronic fabrication in accord with the preferred embodiment of the present invention. The microelectronic fabrication has formed therein a dual damascene aperture (i.e., comprising the extended trench 15' overlapping the extended via 11''') with enhanced dimensional control incident to forming the dual damascene aperture with a blanket second dielectric layer having formed therein a void within a via portion of the dual damascene aperture to thus form an incompletely filled via, such that when re-opening the incompletely filled via to form therefrom a re-opened via when etching the blanket second dielectric layer the blanket second dielectric layer is etched efficiently and uniformly within the incompletely filled via when forming the re-opened via.

As is understood by a person skilled in the art, the preferred embodiment of the present invention is illustrative of the present invention rather than limiting of the present invention. Revisions and modifications may be made to methods, materials, structures and dimensions employed for forming a dual damascene aperture in accord with the preferred embodiment of the present invention, while forming a dual damascene aperture in accord with the present invention, further in accord with the accompanying claims.

What is claimed is:

1. A method for forming a dual damascene aperture comprising:

providing a substrate;

forming over the substrate a patterned first dielectric layer which defines at least part of a via;

forming over the patterned first dielectric layer a blanket second dielectric layer deposited such as to incompletely fill the via and form a void within an incompletely filled via;

forming over the blanket second dielectric layer an etch mask layer which defines the location of a trench to be formed through the blanket second dielectric layer and overlapping the via; and etching the blanket second dielectric layer, while employing the etch mask layer, to form the trench overlapping a re-opened via formed from the incompletely filled via, wherein by forming the void within the incompletely filled via there is provided enhanced dimensional control when forming the re-opened via from the incompletely filled via.

2. The method of claim 1 wherein the substrate is employed within a microelectronic fabrication selected from the group consisting of integrated circuit microelectronic fabrications, ceramic substrate microelectronic fabrications and optoelectronic microelectronic fabrications.

3. The method of claim 1 wherein the void occupies from about 30 to about 70 volume percent of the via.

4. The method of claim 1 further comprising forming into the trench overlapping the re-opened via a contiguous patterned conductor interconnect and conductor stud layer.

5. A method for forming a dual damascene aperture comprising:

providing a substrate;

forming over the substrate a patterned first dielectric layer having formed aligned thereupon a patterned etch stop layer which in an aggregate define at least part of a via;

forming over the patterned etch stop layer a blanket second dielectric layer deposited such as to incompletely fill the via and form a void within an incompletely filled via;

forming over the blanket second dielectric layer an etch mask layer which defines the location of a trench to be formed through the blanket second dielectric layer and overlapping the via; and etching the blanket second dielectric layer, while employing the etch mask layer and the patterned etch stop layer, to form the trench overlapping a re-opened via formed from the incompletely filled via.

6. The method of claim 5 wherein by forming the void within the incompletely filled via there is provided enhanced dimensional control when forming the re-opened via from the incompletely filled via.

7. The method of claim 5 wherein the substrate is employed within a microelectronic fabrication selected from the group consisting of integrated circuit microelectronic fabrications, ceramic substrate microelectronic fabrications and optoelectronic microelectronic fabrications.

8. The method of claim 5 wherein the void occupies from about 30 to about 70 volume percent of the via.

9. The method of claim 5 further comprising forming into the trench contiguous with the re-opened via a contiguous patterned conductor interconnect and conductor stud layer.

* * * * *